United States Patent
Kambe et al.

(10) Patent No.: US 8,455,863 B2
(45) Date of Patent: Jun. 4, 2013

(54) ORGANIC ELECTROLUMINESCENT ELEMENT HAVING A TRANSITION-METAL-COMPLEX LAYER, AND DISPLAY AND ELECTRONIC APPARATUS INCLUDING THE SAME

(75) Inventors: Emiko Kambe, Kanagawa (JP); Ichinori Takada, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 393 days.

(21) Appl. No.: 12/686,009

(22) Filed: Jan. 12, 2010

(65) Prior Publication Data

US 2010/0181560 A1    Jul. 22, 2010

(30) Foreign Application Priority Data

Jan. 19, 2009    (JP) .................................. 2009-008708

(51) Int. Cl.
*H01L 29/08* (2006.01)
(52) U.S. Cl.
USPC .................................. 257/40; 438/82; 438/90
(58) Field of Classification Search
USPC ........................................ 257/40; 438/82, 90
See application file for complete search history.

(56) References Cited

U.S. PATENT DOCUMENTS

| | | | |
|---|---|---|---|
| 2007/0235742 A1* | 10/2007 | Tobise et al. | .................... 257/79 |
| 2007/0252516 A1 | 11/2007 | Kondakova | |
| 2009/0066225 A1 | 3/2009 | Kimura | |
| 2009/0179552 A1* | 7/2009 | Froehlich et al. | ............. 313/504 |

FOREIGN PATENT DOCUMENTS

| | | |
|---|---|---|
| CN | 20060008810.5 | 3/2008 |
| EP | 1524707 A2 | 4/2005 |
| JP | 2007-173779 | 7/2007 |
| WO | 2006 100896 A1 | 9/2006 |

OTHER PUBLICATIONS

European Search Report including Supplement for Application No. 10000006.6-1235 / 2209148 dated Jan. 30, 2012.
Corey J. Bloom, et al., Low Work Function Reduced Metal Complexes as Cathodes in Organic Electroluminescent Devices, Journal of Physical Chemistry B, Materials, Surfaces, Interfaces and Biophysical, Washington, DC, vol. 107, No. 13, Apr. 3, 2003.
European Communication dated Mar. 14, 2012 for Application No. 10 000 006.6-1235.
Chinese Office Action dated Jun. 9, 2011 for Chinese Application No. 201010001824.2.

* cited by examiner

*Primary Examiner* — Kimberly Rizkallah
*Assistant Examiner* — Caleb Henry
(74) *Attorney, Agent, or Firm* — Dentons US LLP

(57) ABSTRACT

An organic electroluminescent element includes an electron-transport layer composed of a heterocyclic compound, a negative electrode composed of a metal material, and a transition-metal-complex layer arranged between the electron-transport layer and the negative electrode.

7 Claims, 8 Drawing Sheets

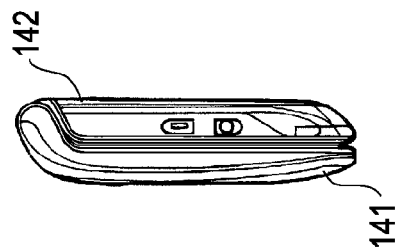
FIG. 9E
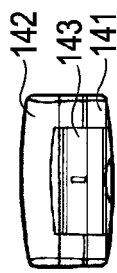
FIG. 9F
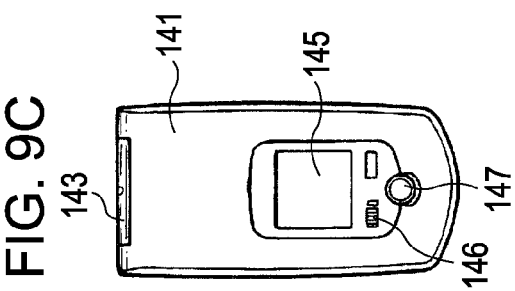
FIG. 9C
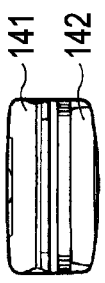
FIG. 9G
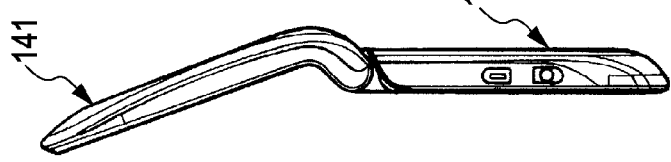
FIG. 9D
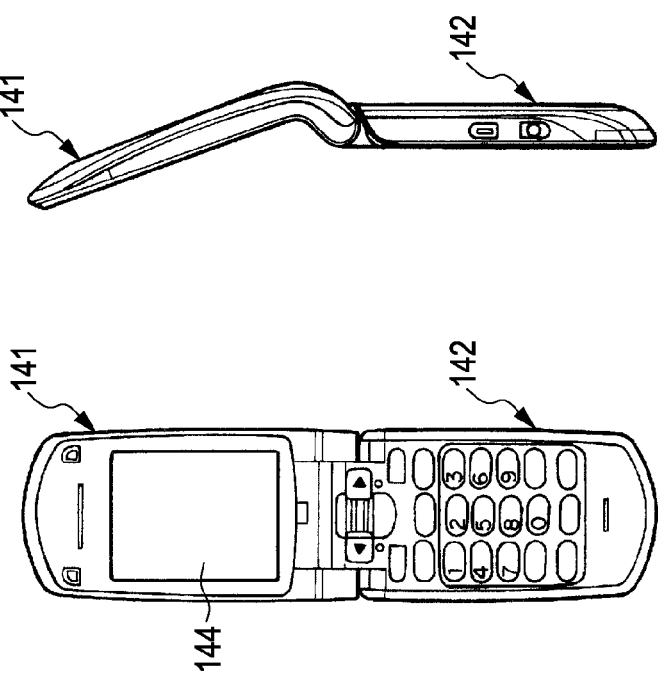
FIG. 9B
FIG. 9A

ORGANIC ELECTROLUMINESCENT ELEMENT HAVING A TRANSITION-METAL-COMPLEX LAYER, AND DISPLAY AND ELECTRONIC APPARATUS INCLUDING THE SAME

BACKGROUND OF THE INVENTION

1. Field of the Invention

The present invention relates to an organic electroluminescent element, a display, and an electronic apparatus, and in particular, to an organic electroluminescent element suitable for a structure in which light emerges from a negative electrode side and relates to a display and an electronic apparatus each including the organic electroluminescent element.

2. Description of the Related Art

Organic electroluminescent elements (organic EL elements) utilizing electroluminescence of organic materials each include an organic luminescent functional layer having a luminous sublayer provided between a positive electrode and a negative electrode and have been receiving attention as luminous elements capable of achieving high-luminance light emission at low-voltage DC drive. In organic electroluminescent elements, various layer structures have been studied in order to improve luminous properties and lifetime characteristics.

For example, it is reported that the arrangement of an electron-injection layer at the interface between the negative electrode and the organic luminescent functional layer improves the injection efficiency of electrons from the negative electrode into the luminous sublayer. It is reported that examples of a material that can be used for the electron-injection layer include inorganic materials such as lithium fluoride (LiF); and a lithium quinolinol complex (Liq) (see Japanese Unexamined Patent Application Publication No. 2007-173779, paragraph No. 0048).

SUMMARY OF THE INVENTION

Meanwhile, in an organic electroluminescent element, an organic material constituting an organic luminescent functional layer is readily degraded by reaction with water and oxygen. Thus, covering the entirety of the organic electroluminescent element with a protective film composed of an inorganic material such as silicon nitride prevents the infiltration of water and oxygen. In such a structure, however, a stress is readily generated between the protective film and the organic electroluminescent element. This causes a deterioration in lifetime characteristics due to the detachment of the organic electroluminescent element from the negative electrode and the occurrence of failure, such as dark and bright sports.

It is desirable to provide a highly reliable organic electroluminescent element having satisfactory lifetime characteristics without the occurrence of dark or bright sports and to provide a display and an electronic apparatus each including the organic electroluminescent element.

According to an embodiment of the present invention, there is provided an organic electroluminescent element including an electron-transport layer composed of a heterocyclic compound, a negative electrode composed of a metal material, and a transition-metal-complex layer arranged between the electron-transport layer and the negative electrode.

In the organic electroluminescent element having such a structure, despite the arrangement of the transition-metal-complex layer having low electron mobility between the electron-transport layer and the negative electrode, the lifetime characteristics are satisfactory, and the occurrence of dark and bright spots are prevented, as compared with an element that does not include the transition-metal-complex layer.

BRIEF DESCRIPTION OF THE DRAWINGS

FIG. 6A is a perspective view of the digital camera when viewed from the front side thereof, and FIG. 6B is a perspective view of the digital camera when viewed from the rear side thereof;

FIGS. 9A to 9G show a portable terminal device, such as a cellular phone, to which an embodiment of the present invention is applied, FIG. 9A is a front view of the device in an open state, FIG. 9B is a side view thereof, FIG. 9C is a front view of the device in a closed state, FIG. 9D is a left-side view thereof, FIG. 9E is a right-side view thereof, FIG. 9F is a top view thereof, and FIG. 9G is a bottom view thereof.

DESCRIPTION OF THE PREFERRED EMBODIMENTS

Embodiments of the present invention will be described in the following order:
1. structure of organic electroluminescent element;
2. structure of display; and
3. structure of electronic apparatus.

1. Structure of Organic Electroluminescent Element

Figure 1:
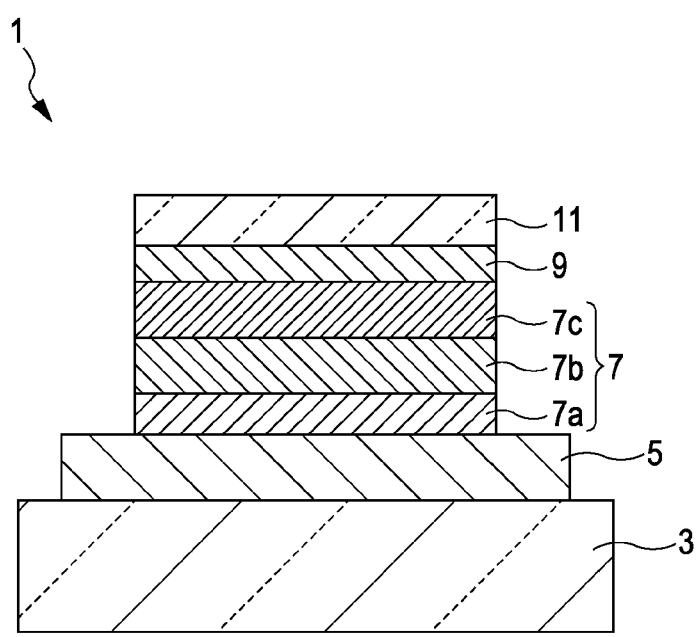
FIG. 1 is a cross-sectional view of an organic electroluminescent element according to an embodiment.

FIG. 1 is a schematic cross-sectional view of an organic electroluminescent element according to an embodiment of the present invention. An organic electroluminescent element 1 shown in the figure includes a positive electrode 5, an organic luminescent functional layer 7, a transition-metal-complex layer 9, and a negative electrode 11 stacked, in that order, on a substrate 3. The organic luminescent functional layer 7 includes, for example, a hole-injection/transport sublayer 7a, a luminous sublayer 7b, and an electron-transport sublayer 7c stacked, in that order, from the positive electrode 5 side. The negative electrode 11 is covered with a protective film (not shown) composed of an inorganic material.

An embodiment of the present invention includes the arrangement of the transition-metal-complex layer 9 between the electron-transport sublayer 7c composed of a heterocyclic compound and the negative electrode 11 composed of a metal material. Hereinafter, the organic electroluminescent element 1 having the above stacked structure functions as a top-emission element in which light emerges from the side of the negative electrode 11 opposite the substrate 3 composed of a metal material. Details of the layers in this case will be described in order from the substrate 3 side.

Substrate

The substrate 3 serves as a support having a main surface on which the organic electroluminescent element 1 is arranged and may be a substrate of the related art. Examples of the substrate include films and sheets of quartz, glass, resins; and metal foil. Among these materials, quartz and glass are preferred. In the case of using a resin, examples of the resin include methacrylic resins such as poly(methyl methacrylate) (PMMA); polyesters, such as poly(ethylene terephthalate) (PET), poly(ethylene naphthalate) (PEN), and poly(butylene naphthalate) (PBN): and polycarbonate resins. It is necessary to produce a stacked structure or perform surface treatment to suppress the infiltration of water and gases. Furthermore, in the case of using a top-emission structure in which light emerges from the top, the substrate may not be optically transparent. For example, a Si substrate may be used. In the case of using an active element, the active element may be directly produced on the Si substrate.

Positive Electrode

To efficiently inject holes, the positive electrode 5 is composed of an electrode material having a high work function from the vacuum level. Examples of the material include metals, such as aluminum (Al), chromium (Cr), molybdenum (Mo), tungsten (W), copper (Cu), silver (Ag), and gold (Au), alloys thereof, oxides of the metals and the alloys, alloys of tin oxide ($SnO_2$) and antimony (Sb), indium-tin oxide (ITO), indium-zinc oxide (InZnO), and alloys of zinc oxide (ZnO) and aluminum (Al). Furthermore, the oxides of the metals and alloys may be used separately or in combination as a mixture.

The positive electrode 5 may have a stacked structure including a first layer having good light reflectivity and a second layer arranged on the first layer, the second layer having optical transparency and a high work function.

The first layer is preferably composed of an alloy mainly containing aluminum. An auxiliary component of the alloy may contain at least one element having a work function relatively lower than that of aluminum as a main component. A lanthanoid series element is preferred as the auxiliary component. Although the work function of the lanthanoid series element is not high, the incorporation of the element into the positive electrode improves the stability of the positive electrode and ensures a high hole-injection ability of the positive electrode. The auxiliary component may contain an element, such as silicon (Si) and copper (Cu), in addition to the lanthanoid series element.

The auxiliary component content of the aluminum alloy layer constituting the first layer is preferably about 10% by weight or less in total when the auxiliary component is, for example, Nd, Ni, or Ti, which stabilizes aluminum. In this case, the aluminum alloy layer is kept stable during the production process of the organic electroluminescent element while the reflectivity of the aluminum alloy layer is maintained. Furthermore, it is possible to achieve processing accuracy and chemical stability. Moreover, it is possible to improve the conductivity of the positive electrode 5 and the adhesion of the positive electrode 5 to the substrate 3.

For example, the second layer is composed of at least one selected from an oxide of an aluminum alloy, molybdenum oxide, zirconium oxide, chromium oxide, and tantalum oxide. For example, in the case where the second layer is an oxide layer (including a natural oxide film) of an aluminum alloy containing a lanthanoid series element as an auxiliary component, the second layer containing the lanthanoid series element has good transmittance because of high transmittance of an oxide of the lanthanoid series element. It is thus possible to maintain high reflectivity on a surface of the first layer. The second layer may be an optically transparent conductive layer composed of, for example, indium-tin oxide (ITO) or indium-zinc oxide (IZO). The conductive layer can improve the electron injection properties of the positive electrode 5.

A conductive layer configured to improve the adhesion between the positive electrode 5 and the substrate 3 may be arranged on a surface of the positive electrode 5 adjacent to the substrate 3. Examples of the conductive layer include optically transparent conductive layers composed of, for example, ITO and IZO.

In the case where a display including the organic electroluminescent element 1 is an active-matrix display, the positive electrode 5 is patterned in each pixel and connected to driver thin-film transistors arranged on the substrate 3. Furthermore, the positive electrode 5 is overlaid with an insulating film (not shown) in such a manner that a surface of the positive electrode 5 in each pixel is exposed through an opening of the insulating film.

Hole-Injection/Transport Sublayer

The hole-injection/transport sublayer 7a is configured to increase the efficiency of hole injection into the luminous sublayer 7b. The hole-injection/transport sublayer 7a may have a structure in which a hole-transport subsublayer is stacked on a hole-injection subsublayer. Each of the subsublayers may have a stacked structure. Examples of a material constituting the sublayer include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazon, stilbene, and derivatives thereof; polysilane compounds; and monomers, oligomers, and polymers of conjugated heterocyclic compounds, such as vinylcarbazole compounds, thiophene compounds, and aniline compounds.

Specific examples of the material for the hole-injection/transport sublayer 7a include, but are not limited to, α-naphthylphenylphenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2'-thienylpyrrole).

Luminous Sublayer

The luminous sublayer 7b is a region where holes injected from the side of the positive electrode 5 are recombined with electrons injected from the side of the negative electrode 11 during the application of a voltage to the positive electrode 5 and the negative electrode 11. In this embodiment, any material selected from materials used in the related art may be used. Examples of a luminous material include compounds having good thin-film formability, e.g., fused polycyclic aromatic hydrocarbons, fluorescent brightening agent, such as benzoxazole, benzothiazole, and benzimidazole, metal chelated oxinoid compounds, and distyrylbenzene compounds. Examples of fused polycyclic aromatic hydrocarbons include anthracene, naphthalene, phenanthrene, pyrene, chrysene, fused-ring luminous substances each containing a perylene skeleton, and other fused-ring luminous substances each containing about eight fused rings. Specifically, 1,1,4,4-tetraphenyl-1,3-butadiene, 4,4'-(2,2-diphenylvinyl)biphenyl, and so forth may be used. The luminous sublayer may be a single layer composed of at least one selected from these luminous materials. Alternatively, the luminous sublayer may be stacked on another luminous sublayer composed of a compound different from the above-described materials.

Electron-Transport Sublayer

The electron-transport sublayer 7c is configured to transport electrons to the luminous sublayer 7b. According to an embodiment of the present invention, in particular, the electron-transport sublayer 7c is composed of a heterocyclic compound that is a nitrogen-containing cyclic compound with nitrogen as a hetero atom constituting the heterocycle.

Examples of the nitrogen-containing heterocyclic compound include quinoline, phenanthroline, pyrazine, triazole, oxazole, oxadiazole, benzimidazole, derivatives thereof, and metal complexes thereof.

Specific examples thereof include benzimidazole derivatives represented by compounds (N-1) to (N-13), tris(8-hydroxyquinolinato)aluminum (abbreviated as "Alq$_3$") represented by compound (N-14), and 1,10-phenanthroline derivatives represented by compounds (N-15) to (N-22). Furthermore, examples thereof include acridine derivatives and stilbene derivatives.

Chemical Formulae 1-1

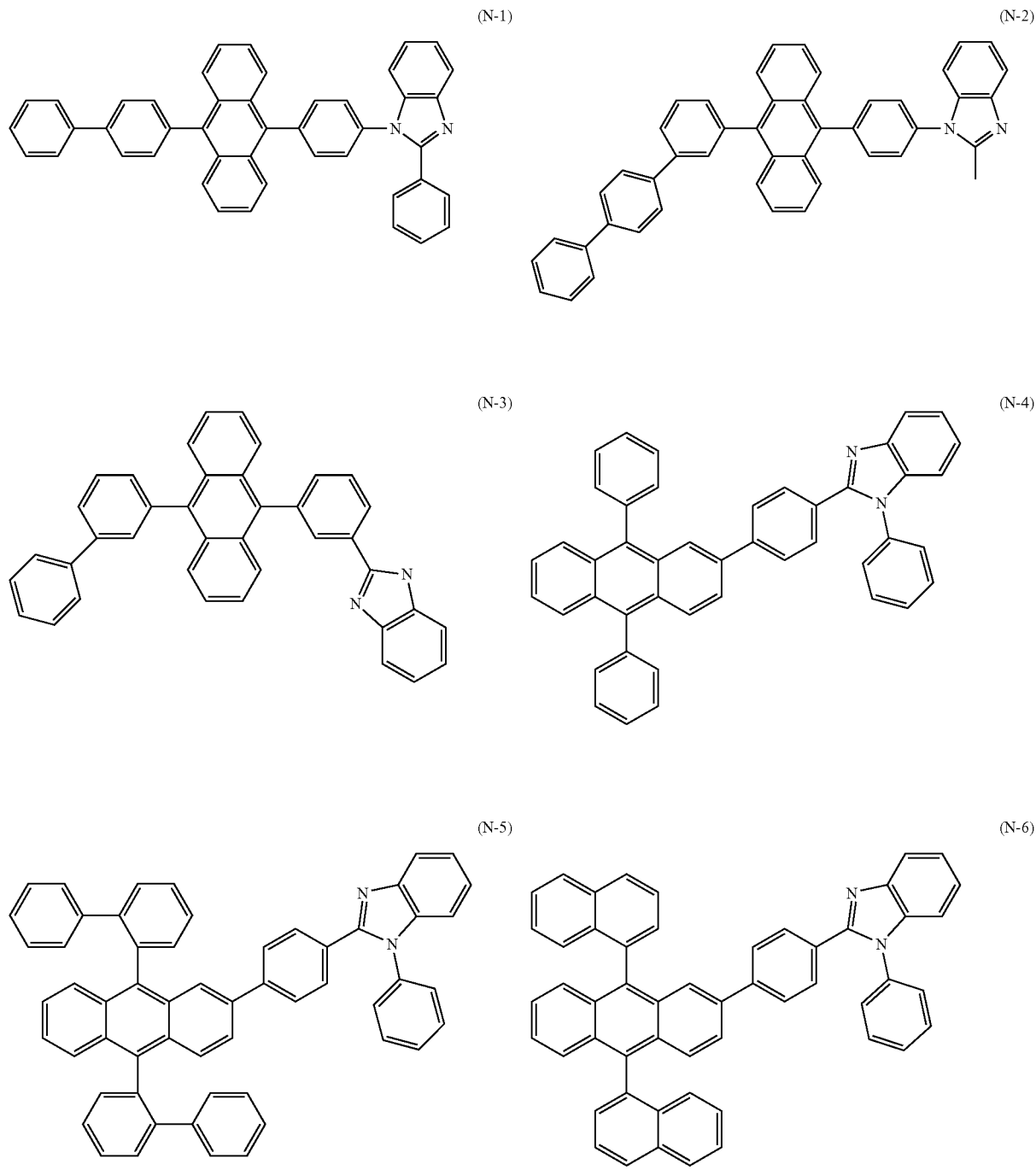

(N-7)
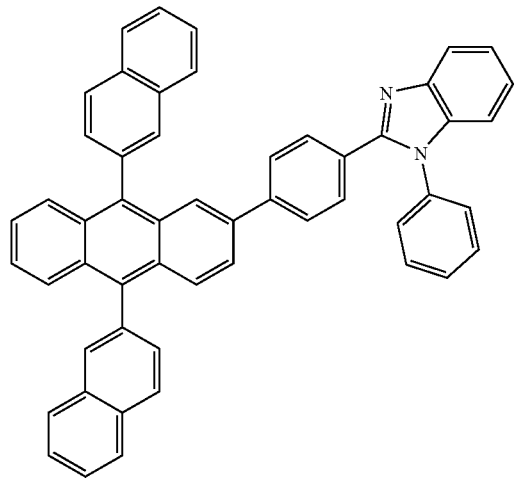
(N-8)
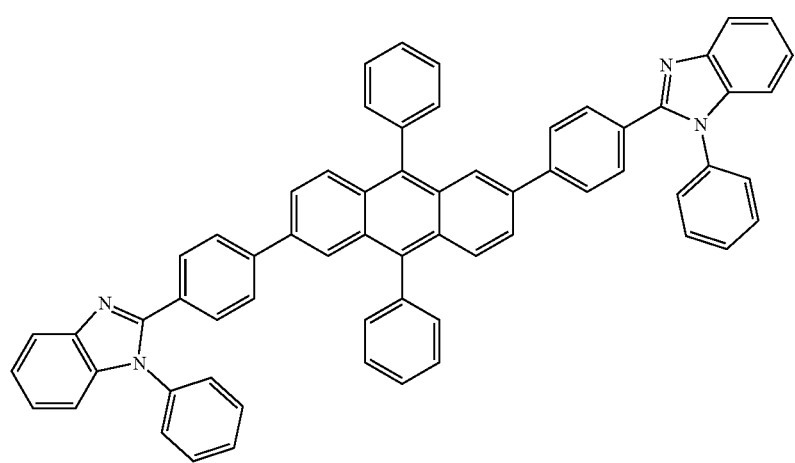
(N-9)
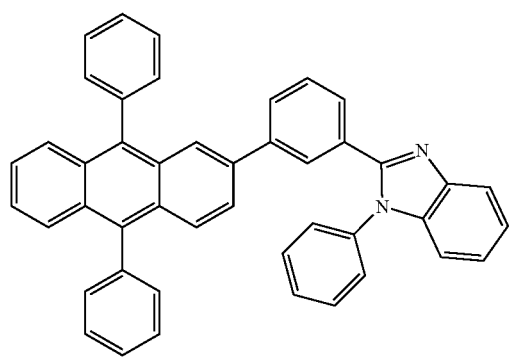
(N-10)
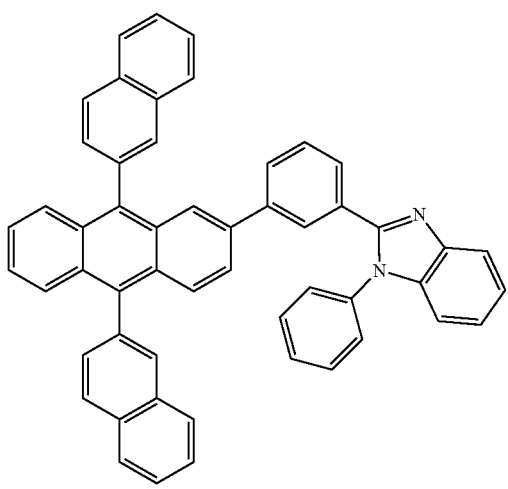

-continued
(N-11)
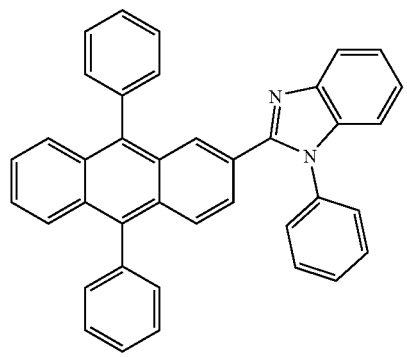
(N-12)
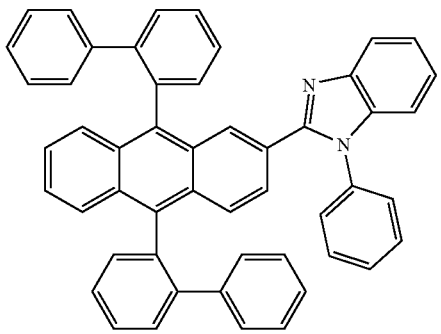
(N-13)
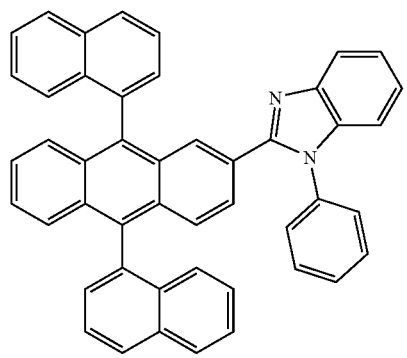
Chemical Formulae 1-2
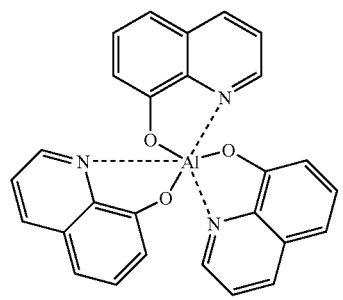
Alq3
(N-14) (N-15)
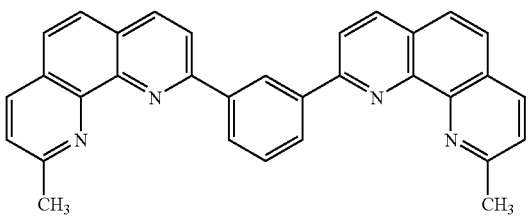
(N-16) (N-17)
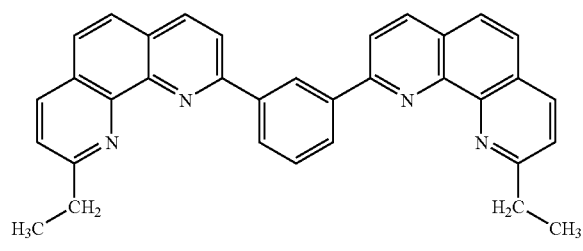 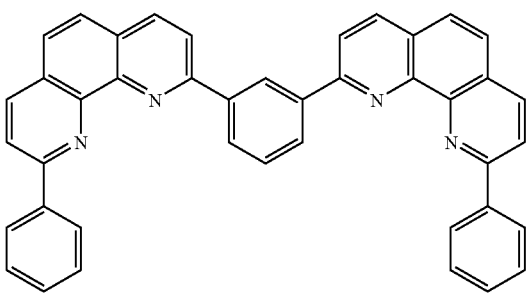

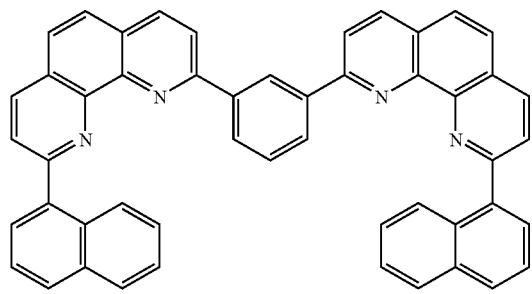
(N-18)

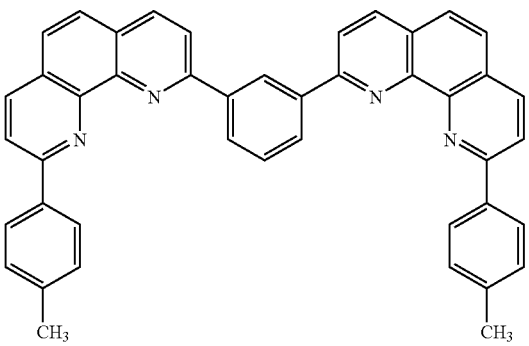
(N-19)

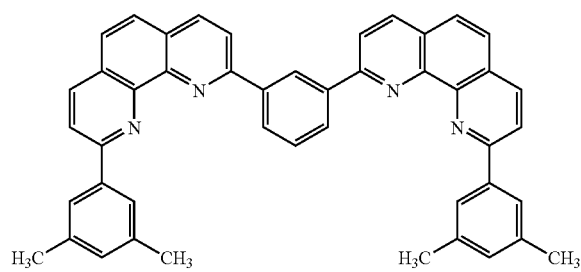
(N-20)

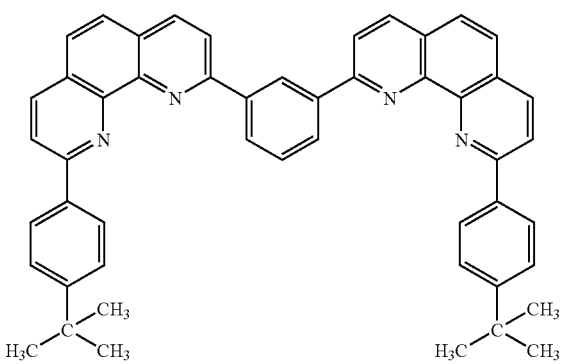
(N-21)

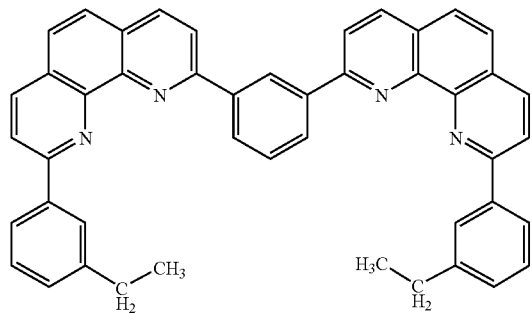
(N-22)

Transition-Metal-Complex Layer

The transition-metal-complex layer 9 is a thin film composed of a metal complex with a transition metal as a central metal. The central metal has a coordination number of two or more. Examples of the transition metal that can be used as the central metal include first-row transition-metals (3$d$ transition elements), second-row transition metals (4$d$ transition elements), and third-row transition metals (4$f$ transition elements). The transition-metal-complex layer 9 preferably has a thickness of 10 nm or less and more preferably 2 nm or less. It is important to maintain the amount of electrons injected from the negative electrode 11 into the organic luminescent functional layer 7 by arranging the transition-metal-complex layer 9 having such a small thickness.

Specific examples of the transition-metal complex constituting the transition-metal-complex layer 9 include compounds (A-1) to (A-19) described below.

Chemical Formulae 2-1

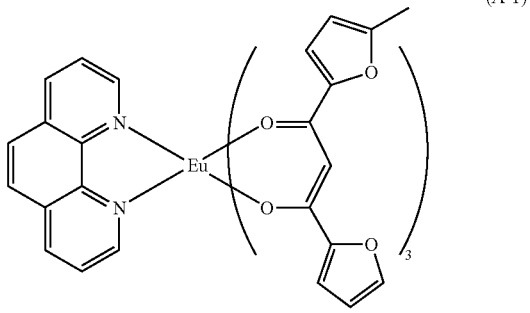
(A-1)

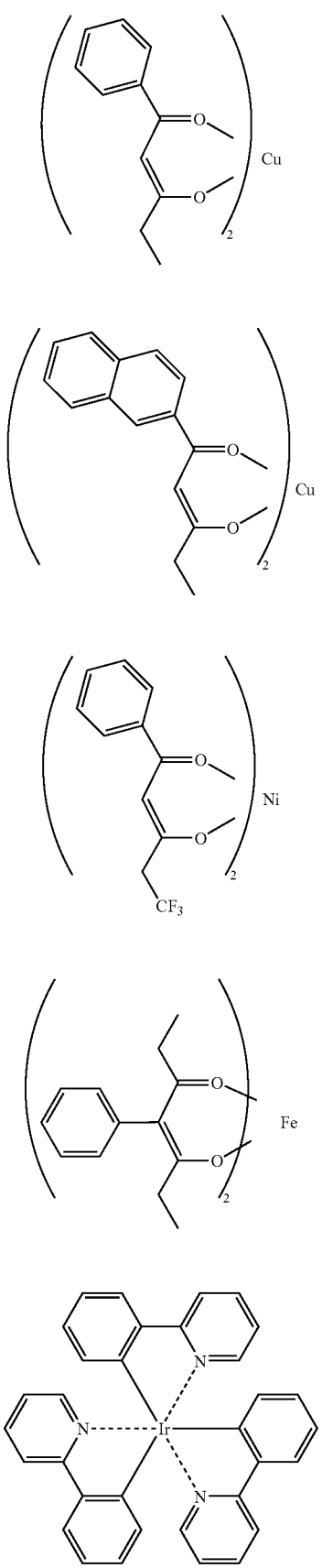
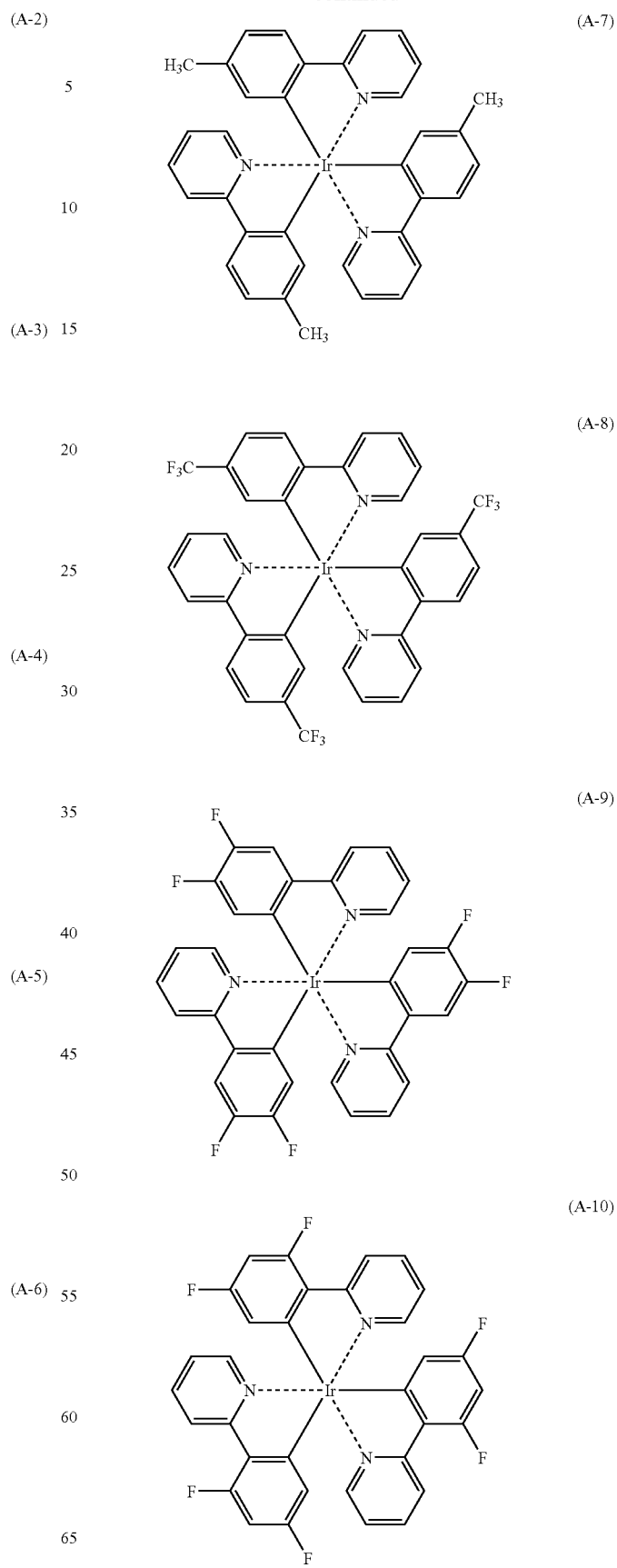

-continued (A-11)

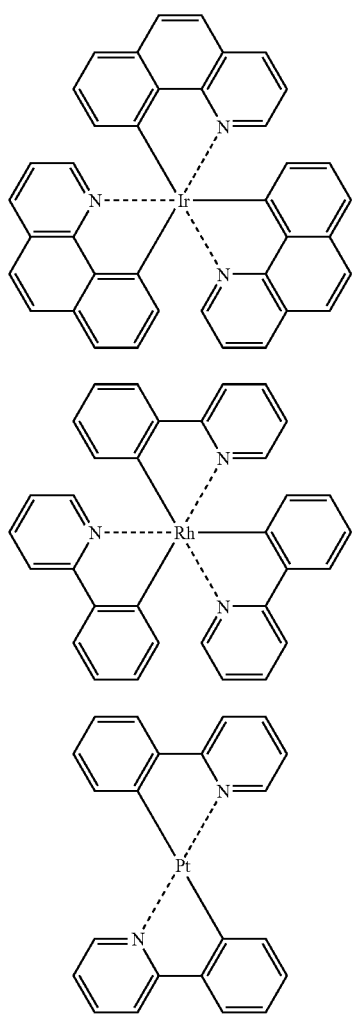

Chemical Formulae 2-2

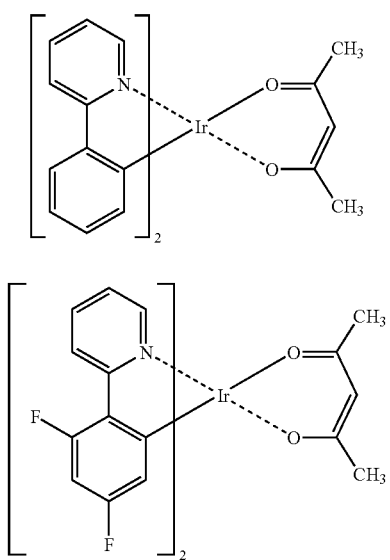

(A-14)

(A-15)

-continued

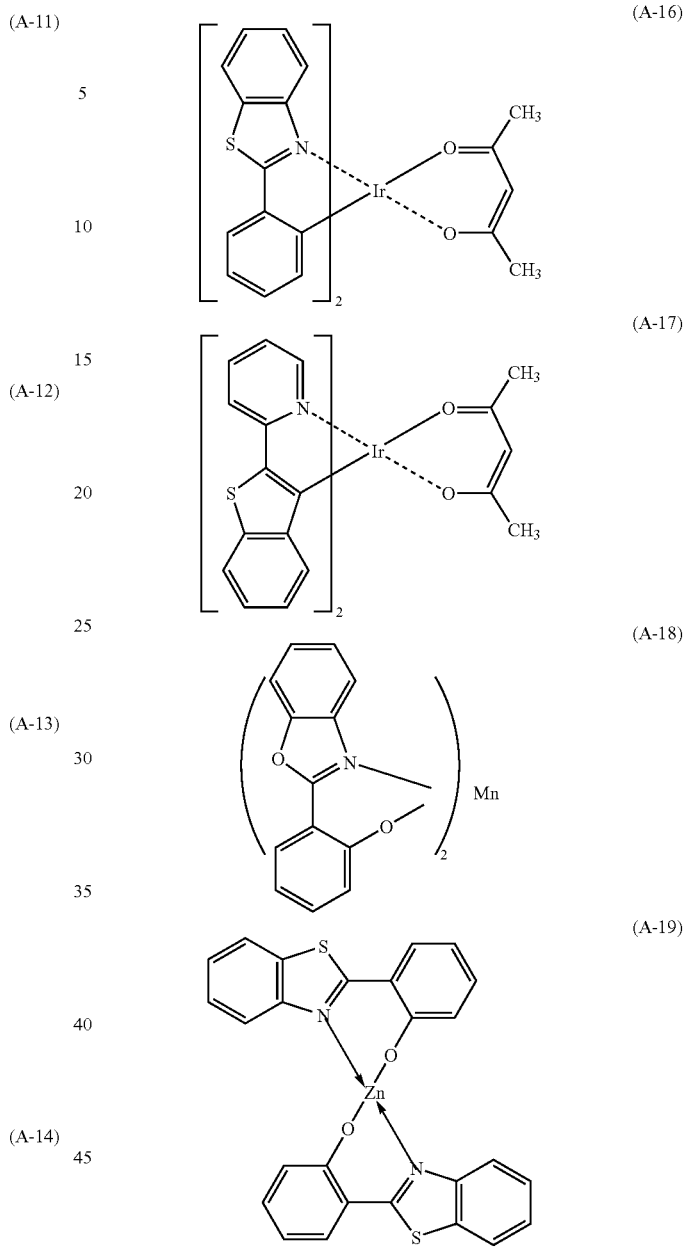

Negative Electrode

The negative electrode 11 is composed of a metal material and has optical transparency. In the case where the organic electroluminescent element 1 has a resonator structure, the negative electrode 11 is transflective. This allows light emitted from the luminous sublayer 7b to emerge with good color purity.

The negative electrode 11 may have a two-layer structure in which a first layer serving as an electron-injection layer and a second layer serving as a metal negative-electrode layer are stacked in that order from the side of organic luminescent functional layer 7. Alternatively, the negative electrode 11 may have a single-layer structure of a metal negative-electrode layer alone. Preferably, the negative electrode 11 has a single-layer structure of a metal negative-electrode layer alone from the viewpoint of extending the service life.

In the case of arranging the electron-injection layer, the electron-injection layer is composed of a material having a low work function and satisfactory optical transparency. Examples of the material that can be used include lithium oxide ($Li_2O$), which is an oxide of lithium (Li), cesium carbonate ($Cs_2CO_3$), which is a complex oxide of cesium (Cs), and mixtures of the oxide and the complex oxide. However, the material constituting the electron-injection layer is not limited thereto. Examples of the material further include metals with low work functions, e.g., alkaline-earth metals such as calcium (Ca) and barium (Ba), alkali metals such as lithium and cesium, indium (In), and magnesium (Mg); and oxides, complex oxides, and fluorides of the metals. These materials may be used separately or in combination as a mixture. Alternatively, these materials may be used as an alloy thereof for a higher level of safety. Furthermore, the electron-injection layer is not limited to the inorganic materials described above but may be composed of an organic material such as a lithium quinolinol complex (Liq).

The metal negative-electrode layer is a thin film composed of an optically transparent material such as MgAg. The metal negative-electrode layer may further contain an organic luminescent material, such as an aluminum quinoline complex, a styrylamine derivative, or a phthalocyanine derivative. In this case, an optically transparent layer composed of, for example, MgAg may be further arranged as a third layer.

In the case where a display including the organic electroluminescent element 1 is an active-matrix display, the negative electrode 11 is arranged above the substrate 3 so as to be insulated from the positive electrode 5 by the organic luminescent functional layer 7 and so forth and is used as a common electrode to individual pixels.

A current applied to the organic electroluminescent element 1 having the structure described above is usually a direct current. Alternatively, a pulsed current or an alternating current may be used. Current and voltage values are not particularly limited as long as the element is not damaged. It is desirable to efficiently emit light at lower electrical energy in light of the electrical power consumption and lifetime of the organic electroluminescent element.

In the case where the organic electroluminescent element 1 has a resonator structure, emitted light is subjected to multiple interference between a light-reflecting surface of the transflective negative electrode 11 and a light-reflecting surface of the positive electrode 5 side and then emerges from the side of the negative electrode 11. In this case, the optical distance between the light-reflecting surface of the positive electrode 5 side and the light-reflecting surface of the negative electrode 11 side is specified by the wavelength of light that is allowed to emerge. Thicknesses of individual layers are determined so as to satisfy the optical distance. In such a top-emission organic electroluminescent element as described above, the active use of the cavity structure results in improvement in the efficiency of light emission to the outside and the control of the emission spectrum.

Protective Film

The protective film (not shown) serves as a passivation layer configured to prevent the deterioration of the organic material due to, for example, water and oxygen in air. Examples of the protective film include films of silicon nitride (typically, $Si_3N_4$), silicon oxide (typically, $SiO_2$), silicon nitride oxide ($SiN_xO_y$, composition ratio: X>Y), silicon oxynitride ($SiO_xN_y$, composition ratio: X>Y), an inorganic material mainly composed of carbon, e.g., diamond like carbon (DLC), and carbon nanotubes (CN). Each of the films preferably has a single-layer structure or a stacked structure. Among these, a protective film composed of a nitride is preferably used because it is dense and has an extremely high blocking effect against water, oxygen, and other impurities, which adversely affect the organic electroluminescent element 1.

The foregoing organic electroluminescent element 1 according to an embodiment of the present invention includes the arrangement of the transition-metal-complex layer 9 between the electron-transport sublayer 7c and the negative electrode 11. According to the organic electroluminescent element 1 having the structure, it is possible to improve lifetime characteristics and prevent the occurrence of dark and bright spots as described in examples below.

Usually, transition-metal complexes are often used as hole-transport materials or luminous dopants and have low electron mobility. The transition-metal-complex layer 9, however, functions as a layer configured to improve the adhesion between the electron-transport sublayer 7c composed of an organic material and the negative electrode 11. Even in the case where internal stress in the organic electroluminescent element 1 is caused by covering the element with the protective film composed of an inorganic material, the transition-metal-complex layer 9 can relieve the internal stress. This prevents the detachment of the negative electrode 11 composed of a metal from the organic luminescent functional layer 7 and aggregation in the metal layer constituting the negative electrode 11, thereby improving the long-term operation stability of the element.

The transition-metal-complex layer 9 is a thin film with a thickness of 10 nm or less and preferably 2 nm or less and arranged adjacent to the electron-transport sublayer 7c, thus preventing the injection of excess electrons that cause carrier imbalance in the organic electroluminescent element 1 to reduce the lifetime. Furthermore, the arrangement of the transition-metal-complex layer 9 prevents a reduction in electron-transport capability, thus extending the lifetime while the efficiency is maintained at a comparable level.

The transition-metal-complex layer 9 has a coordination number of two or more and thus has a molecular weight to some extent. Hence, no molecular diffusion occurs in operation, suppressing the change of state in operation and extending the lifetime. In contrast, in a structure of the related art in which a layer composed of, for example, a halide or oxide of an alkali metal or alkaline-earth metal is arranged at the interface between a negative electrode and an electron-transport layer, a metal, such as an alkali metal, having a low molecular weight diffuses readily in operation, thus causing a reduction in lifetime due to the change of state in operation.

In the embodiment described above, the present invention has been described in detail using the top-emission organic electroluminescent element as an example of the organic electroluminescent element. However, the organic electroluminescent element according to an embodiment of the present invention is not limited to application to the top-emission organic electroluminescent element but is widely applicable to a structure in which at least the organic luminescent functional layer 7 having the luminous sublayer 7b is interposed between the positive electrode 5 and the negative electrode 11. Thus, an embodiment of the present invention is applicable to a structure in which the negative electrode 11, the transition-metal-complex layer 9, the organic luminescent functional layer 7, and the positive electrode 5 are stacked in that order from the substrate 3 and also to a bottom-emission (transmissive) organic electroluminescent element in which an electrode (a lower electrode serving as a negative electrode or positive electrode) adjacent to the substrate 3 is a transparent material and an electrode (an upper electrode serving as a negative electrode or positive electrode) opposite the substrate is composed of a reflective material in such a manner that light emerges only from the lower electrode side.

2. Structure of Display

Circuit Structure

Figure 2:
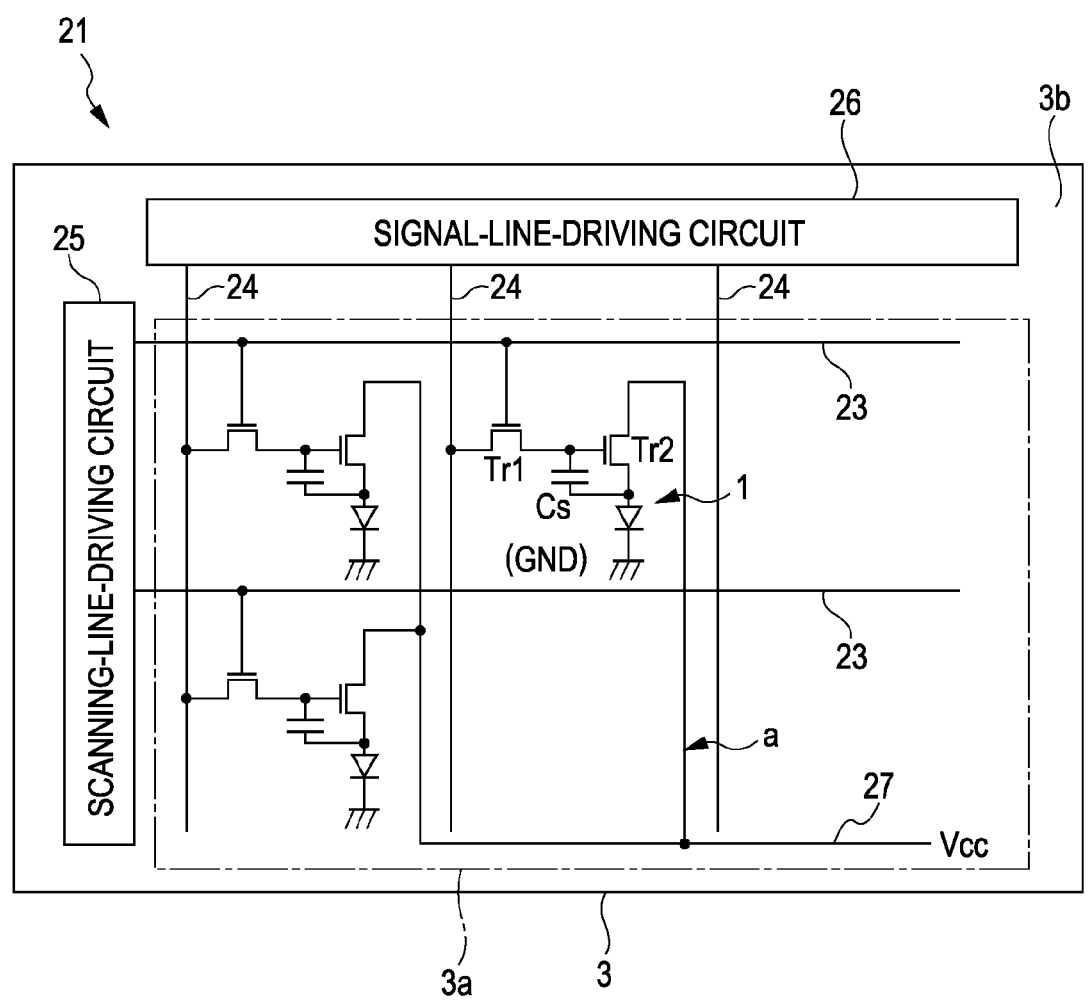
FIG. 2 is an exemplary schematic circuit diagram of a display according to an embodiment.

FIG. 2 is an exemplary schematic circuit diagram of a display including the organic electroluminescent element 1. Here, an embodiment of the present invention applied to an active-matrix display 21 including the organic electroluminescent element 1 will be described.

As shown in this figure, a display region 3a and a peripheral region 3b are defined on the substrate 3 of the display 21. In the display region 3a, plural scanning lines 23 and plural signal lines 24 are arranged in a matrix. A pixel array portion is provided in which one pixel is provided at a corresponding one of intersections thereof. In the peripheral region 3b, a scanning-line-driving circuit 25 configured to drive the scanning lines 23 and a signal-line-driving circuit 26 configured to feed a video signal (i.e., an input signal) corresponding to luminance information to the signal lines 24 are arranged.

Pixel circuits arranged at the intersections of the scanning lines 23 and the signal lines 24 each include, for example, a switching thin-film transistor Tr1, a driving thin-film transistor Tr2, a storage capacitor Cs, and the organic electroluminescent element 1 having the structure described with reference to FIG. 1. When the scanning-line-driving circuit 25 drives a corresponding one of the signal lines 24, a video signal fed from the corresponding signal line 24 through the switching thin-film transistor Tr1 is retained in the storage capacitor Cs. A current in response to the level of the stored signal is fed from the driving thin-film transistor Tr2 to the organic electroluminescent element 1, so that the organic electroluminescent element 1 emits light at a luminance in response to the current. Note that the driving thin-film transistor Tr2 and the storage capacitor Cs are connected to a common power supply line (Vcc) 27.

The structure of each pixel circuit described above is merely an example. A capacitor element may be arranged in the pixel circuit, if necessary. Furthermore, a plurality of transistors may be further arranged to constitute a pixel circuit. Moreover, a necessary driving circuit is arranged in the peripheral region 3b in response to the modification of the pixel circuit.

Cross-Sectional Structure

Figure 3:
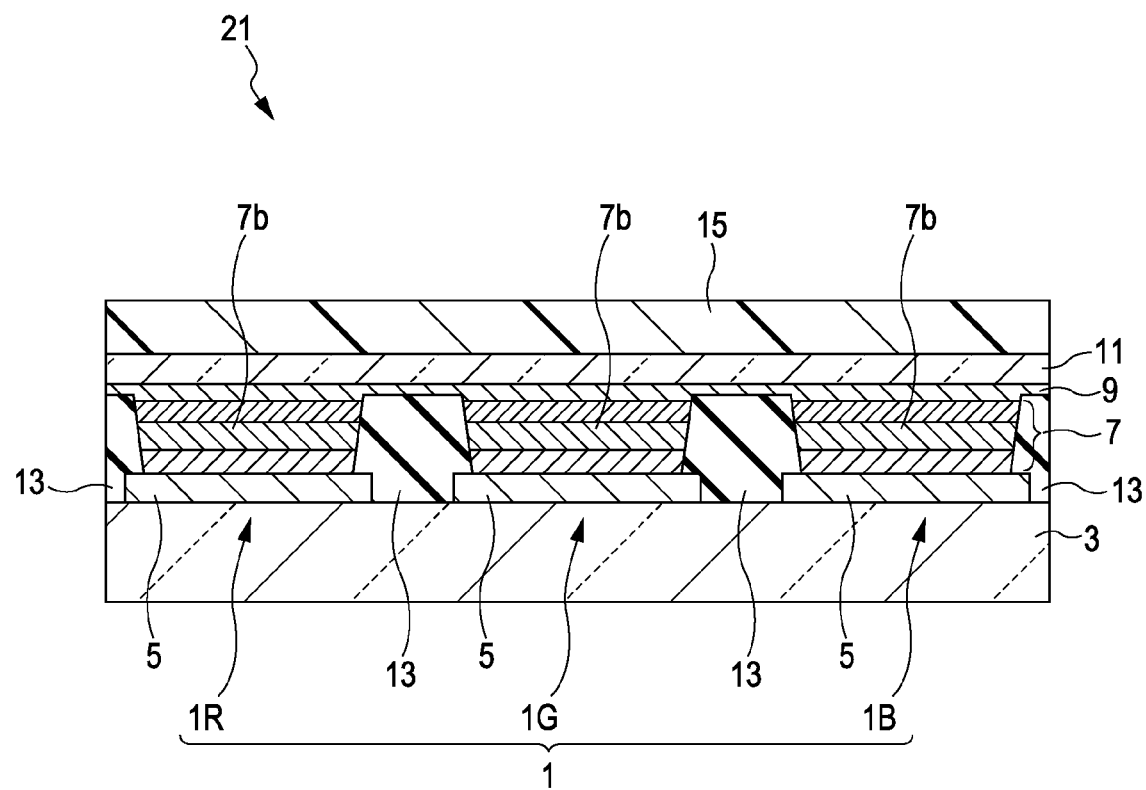
FIG. 3 is an exemplary cross-sectional view of a main portion of a display according to an embodiment.

FIG. 3 shows a first example of a cross-sectional view illustrating a main portion of the display region of the display 21.

In the display region of the substrate 3 on which the organic electroluminescent element 1 is arranged, driving transistors, write transistors, scanning lines, and signal lines, which are not shown, are arranged (see FIG. 2) so as to constitute pixel circuits. An insulating film, not shown, is arranged so as to cover these components.

A red-light-emitting element 1R, a green-light-emitting element 1G, and a blue-light-emitting element 1B are arranged as the organic electroluminescent elements 1 on the substrate 3 covered with the insulating film. Each of the organic electroluminescent elements 1R, 1G, and 1B has a top-emission structure in which light emerges from a side opposite the substrate 3.

The positive electrode 5 of each of the organic electroluminescent elements 1R, 1G, and 1B is formed by patterning for each element. Each of the positive electrodes 5 is connected to the driving transistor in a corresponding one of the pixel circuits through a connection hole formed in the insulating film that covers a surface of the substrate 3.

The periphery of each of the positive electrodes 5 is covered with an insulating film 13. The central portion of each positive electrode 5 is exposed at an opening in the insulating film 13. Each organic luminescent functional layer 7 is formed by patterning so as to cover the exposed portion of a corresponding one of the positive electrodes 5. The transition-metal-complex layer 9 and the negative electrode 11 are arranged as common layers covering the organic luminescent functional layers 7. As described above, a protective film 15 serving as a passivation layer is arranged so as to cover the negative electrode 11. The transition-metal-complex layer 9 may be formed by patterning in the same way as the organic luminescent functional layers 7. In the organic luminescent functional layers 7, at least the luminous sublayers 7b are formed by patterning for each of the organic electroluminescent elements 1R, 1G, and 1B. Other sublayers may be formed as common sublayers.

The layers from the positive electrodes 5 to the negative electrode 11 that constitute the red-light-emitting element 1R, the green-light-emitting element 1G, and the blue-light-emitting element 1B can be formed by a dry process, for example, vacuum deposition, an ion beam method (EB method), molecular beam epitaxy (MBE), sputtering, or organic vapor phase deposition (OVPD).

The organic layers can also be formed by a wet process in addition to the foregoing methods. Examples of the wet process include coating methods, such as a laser transfer method, spin coating, dipping, a doctor blade method, ejection coating, and spray coating; and printing methods, such as an ink-jet method, offset printing, letterpress printing, intaglio printing, screen printing, and microgravure coating. The dry and wet processes may be employed in combination, depending on the properties of the organic layers and materials.

In particular, the organic luminescent functional layers 7 (furthermore, the transition-metal-complex layer 9) are formed by patterning using, for example, vapor deposition or a transfer method with a mask for each of the organic electroluminescent elements 1R, 1G, and 1B.

The embodiments of the present invention applied to the active-matrix display have been described above. However, the display according to an embodiment of the present invention is also applicable to a passive-matrix display. In this case, the same advantages as above can be obtained.

Figure 4:
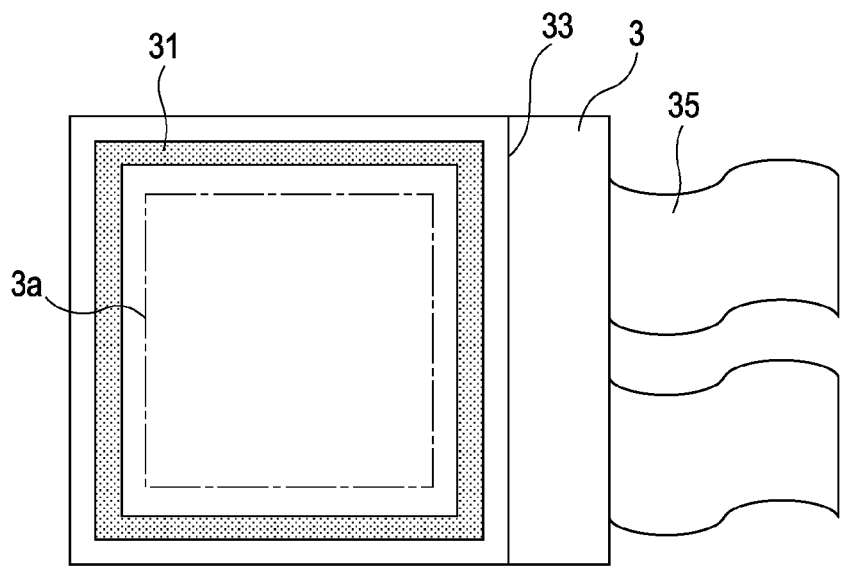
FIG. 4 is a plan view of a sealed modular display to which an embodiment of the present invention is applied.

The display according to an embodiment of the present invention described above includes a sealed modular display as shown in FIG. 4. An example of the sealed modular display is a modular display in which a sealing portion 31 is arranged so as to surround the display region 3a serving as a pixel array portion and in which an opposing member (sealing substrate 33) composed of transparent glass or the like is bonded using the sealing portion 31 as an adhesive. The transparent sealing substrate 33 may include a color filter, a protective film, and a light-shielding film. The substrate 3 having the display region 3a and serving as a modular display may include a flexible printed-circuit board 35 configured to feed a signal from the outside into the display region 3a (pixel array portion) or feed a signal from the display region 3a (pixel array portion) into the outside.

The display 21 has the foregoing structure according to an embodiment of the present invention, thereby improving lifetime characteristics. Furthermore, the display 21 includes the organic electroluminescent element 1 in which the occurrence of dark and bright spots is prevented, so that the long-term reliability and the display properties should be improved.

3. Structure of Electronic Apparatus

The display according to an embodiment of the present invention as described above can be used for display units of various electronic apparatuses shown in FIGS. 5 to 9G. For example, the display is applicable to display units of electronic apparatuses, in all fields, that display video signals fed thereinto or produced therein. Examples of the electronic apparatuses include mobile terminal devices, such as digital cameras, notebook-sized personal computers, and cellular phones, and video cameras. Examples of the electronic apparatuses to which an embodiment of the present invention is applied will be described below.

Figure 5:
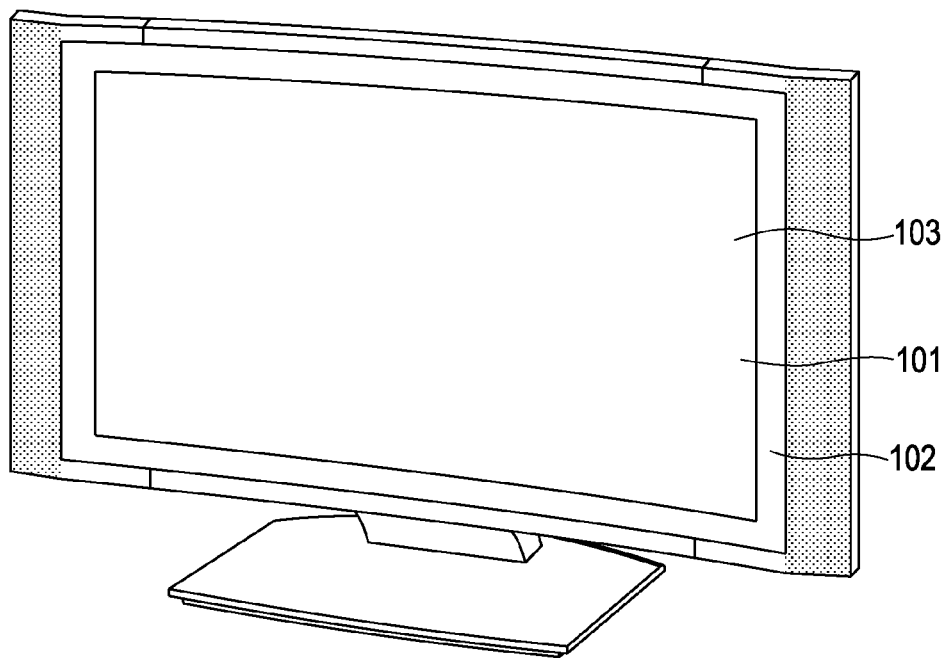
FIG. 5 is a perspective view of a television set to which an embodiment of the present invention is applied.

FIG. 5 is a perspective view of a television set to which an embodiment of the present invention is applied. The television set according to this application example includes a display screen unit 101 having a front panel 102, and a filter glass 103. The display according to an embodiment of the present invention is used as the display screen unit 101.

Figure 6A:
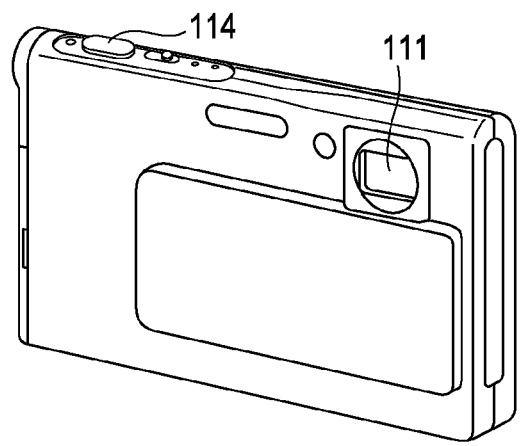
FIGS. 6A and 6B show a digital camera to which an embodiment of the present invention is applied.
Figure 6B:
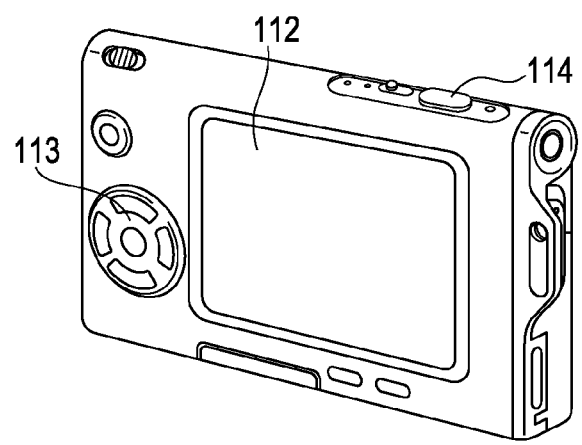

FIGS. 6A and 6B show a digital camera to which an embodiment of the present invention is applied. FIG. 6A is a perspective view of the digital camera when viewed from the front side thereof. FIG. 6B is a perspective view of the digital camera when viewed from the rear side thereof. The digital camera according to this application example includes a flash-light-emission unit 111, a display unit 112, a menu switch 113, and a shutter button 114. The display according to an embodiment of the present invention is used as the display unit 112.

Figure 7:
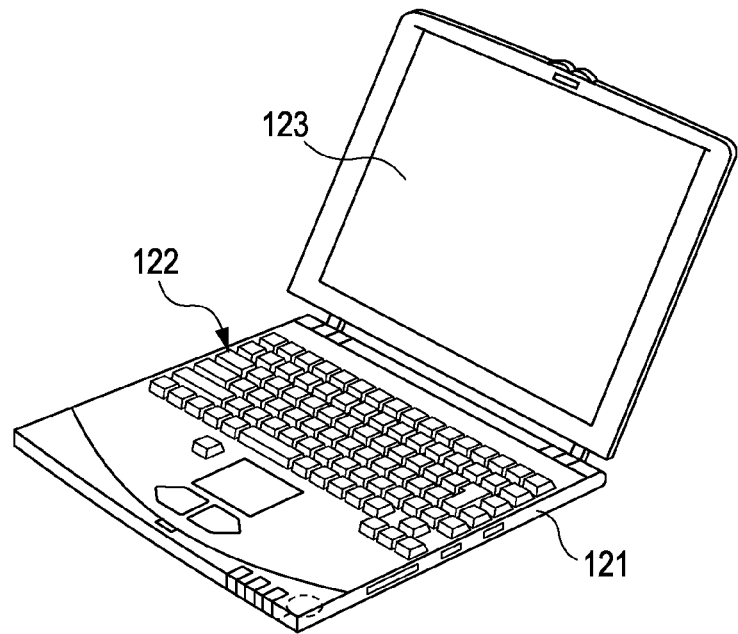
FIG. 7 is a perspective view of a notebook-sized personal computer to which an embodiment of the present invention applied.

FIG. 7 is a perspective view of a notebook-sized personal computer to which an embodiment of the present invention applied. The notebook-sized personal computer according to this application example includes a body 121, a keyboard 122 used when inputting letters and so forth, and a display unit 123 that displays an image. The display according to an embodiment of the present invention is used as the display unit 123.

Figure 8:
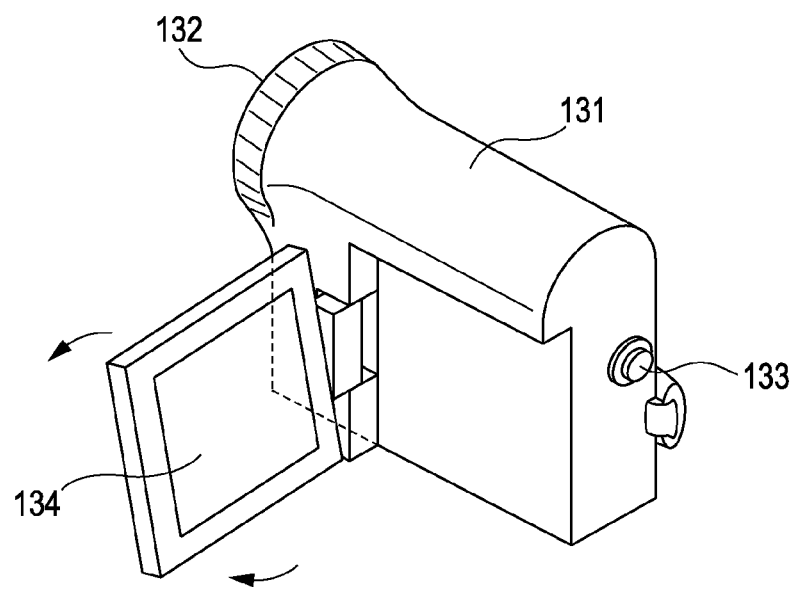
FIG. 8 is a perspective view of a video camera to which an embodiment of the present invention is applied.

FIG. 8 is a perspective view of a video camera to which an embodiment of the present invention is applied. The video camera according to this application example includes a body 131, an objective lens 132 arranged on a side facing forward, a shooting start/stop switch 133, and a display unit 134. The display according to an embodiment of the present invention is used as the display unit 134.

FIGS. 9A to 9G show a portable terminal device, such as a cellular phone, to which an embodiment of the present invention is applied. FIG. 9A is a front view of the device in an open state. FIG. 9B is a side view thereof. FIG. 9C is a front view of the device in a closed state. FIG. 9D is a left-side view thereof. FIG. 9E is a right-side view thereof. FIG. 9F is a top view thereof. FIG. 9G is a bottom view thereof. The cellular phone according to this application example includes an upper casing 141, a lower casing 142, a connection (a hinge herein) 143, a display 144, a subdisplay 145, a picture light 146, and a camera 147. The displays according to an embodiment of the present invention are used for the display 144 and the subdisplay 145.

EXAMPLES

Procedures for making organic electroluminescent elements according to examples and comparative examples of the present invention will be described with reference to FIG. 1, and then evaluation results thereof will be described.

Examples 1 to 7 and Comparative Examples 1 to 9

A 190-nm-thick Ag alloy layer (reflective layer) and a 12.5-nm-thick transparent ITO electrode serving as the positive electrode 5 were stacked, in that order, on the substrate 3 formed of a glass plate measuring 30 mm×30 mm to form a cell for a top-emission organic electroluminescent element.

A 12-nm-thick m-MTDATA film was formed as the hole-injection sublayer 7a of the organic luminescent functional layer 7 by vacuum deposition at a deposition rate of 0.2 to 0.4 nm/sec. m-MTDATA indicates 4,4',4"-tris(phenyl-m-tolylamino)triphenylamine.

A 12-nm-thick α-NPD film was formed as the hole-transport sublayer 7a at a deposition rate of 0.2 to 0.4 nm/sec. α-NPD indicates N,N'-bis(1-naphthyl)-N,N'-diphenyl[1,1'-biphenyl]-4,4'-diamine.

A 30-nm-thick film composed of 9-(2-naphthyl)-10-[4-(1-naphthyl)phenyl]anthracene, serving as a host material, doped with 5% N,N,N',N'-tetra(2-naphthyl)-4,4'-diaminostilbene serving as a blue-light-emitting dopant compound was formed as the luminous sublayer 7b.

As shown in Table 1, in Examples 1 to 7 and Comparative Examples 1 to 9, the electron-transport sublayers 7c were composed of compounds (N-1) to (N-15). The transition-metal-complex layers 9 were composed of compounds (A-1) to (A-19). The negative electrodes 11 were composed of materials shown in the table. Note that Liq constituting the electron-injection layer in Comparative Example 9 is a lithium complex shown below.

TABLE 1

| | | | Negative electrode 11 | | | | | | |
|---|---|---|---|---|---|---|---|---|---|
| | Electron-transport sublayer 7c | Transition-metal-complex layer 9 | Electron-injection layer | Negative electrode metal | Efficiency (cd/A) | Voltage (V) | Lifetime (hr) | Dark spot | Bright spot |
| Example 1 | Compound (N-1) (14 nm) | Compound (A-1) (1 nm) | None | MgAg (10 nm) | 8.6 | 5.4 | 2100 | None | |
| Example 2 | | | LiF (1 nm) | | 8.7 | 5.2 | 1600 | | |
| Example 3 | | Compound (A-2) (1 nm) | None | | 8.4 | 6.4 | 2000 | | |
| Example 4 | Compound (N-1) (10 nm) | Compound (A-2) (5 nm) | LiF (1 nm) | | 8.4 | 7.0 | 1500 | | |
| Example 5 | Compound (N-4) (14 nm) | Compound (A-19) (1 nm) | None | | 7.6 | 5.9 | 1900 | | |
| Example 6 | Compound (N-14) Alq$_3$ (13 nm) | Compound (A-9) (2 nm) | LiF (1 nm) | | 6.1 | 8.1 | 1800 | | |
| Example 7 | Compound (N-15) (14 nm) | Compound (A-4) (1 nm) | None | | 7.1 | 4.3 | 1800 | | |
| Comparative Example 1 | Compound (N-1) (15 nm) | None | LiF (1 nm) | | 8.0 | 5.2 | 920 | 35 | 10 |

TABLE 1-continued

| | Electron-transport sublayer 7c | Transition-metal-complex layer 9 | Negative electrode 11 | | Efficiency (cd/A) | Voltage (V) | Lifetime (hr) | Dark spot | Bright spot |
| --- | --- | --- | --- | --- | --- | --- | --- | --- | --- |
| | | | Electron-injection layer | Negative electrode metal | | | | | |
| Comparative Example 2 | Compound (N-1) (15 nm) | | None | | 7.6 | 5.5 | 600 | 52 | 53 |
| Comparative Example 3 | Compound (N-14) Alq₃ | | LiF (1 nm) | | 3.7 | 8.1 | 1100 | 16 | 10 |
| Comparative Example 4 | (15 nm) | | None | | 2.5 | 17.0 | 400 | 80 | 19 |
| Comparative Example 5 | None | Compound (A-1) (15 nm) | | | Nonluminous | | | Unmeasurable | |
| Comparative Example 6 | Compound (N-14)/(N-15) (5 nm)/(10 nm) | None | LiF (1 nm) | | 3.2 | 9.0 | 600 | 23 | 60 |
| Comparative Example 7 | None | Compound (A-2) (15 nm) | None | | Nonluminous | | | Unmeasurable | |
| Comparative Example 8 | | Compound (A-9) (15 nm) | | | Nonluminous | | | Unmeasurable | |
| Comparative Example 9 | None | None | Liq (15 nm) | | 6.0 | 4.5 | 10 | 1500 | 25 |

Chemical Formulae 3

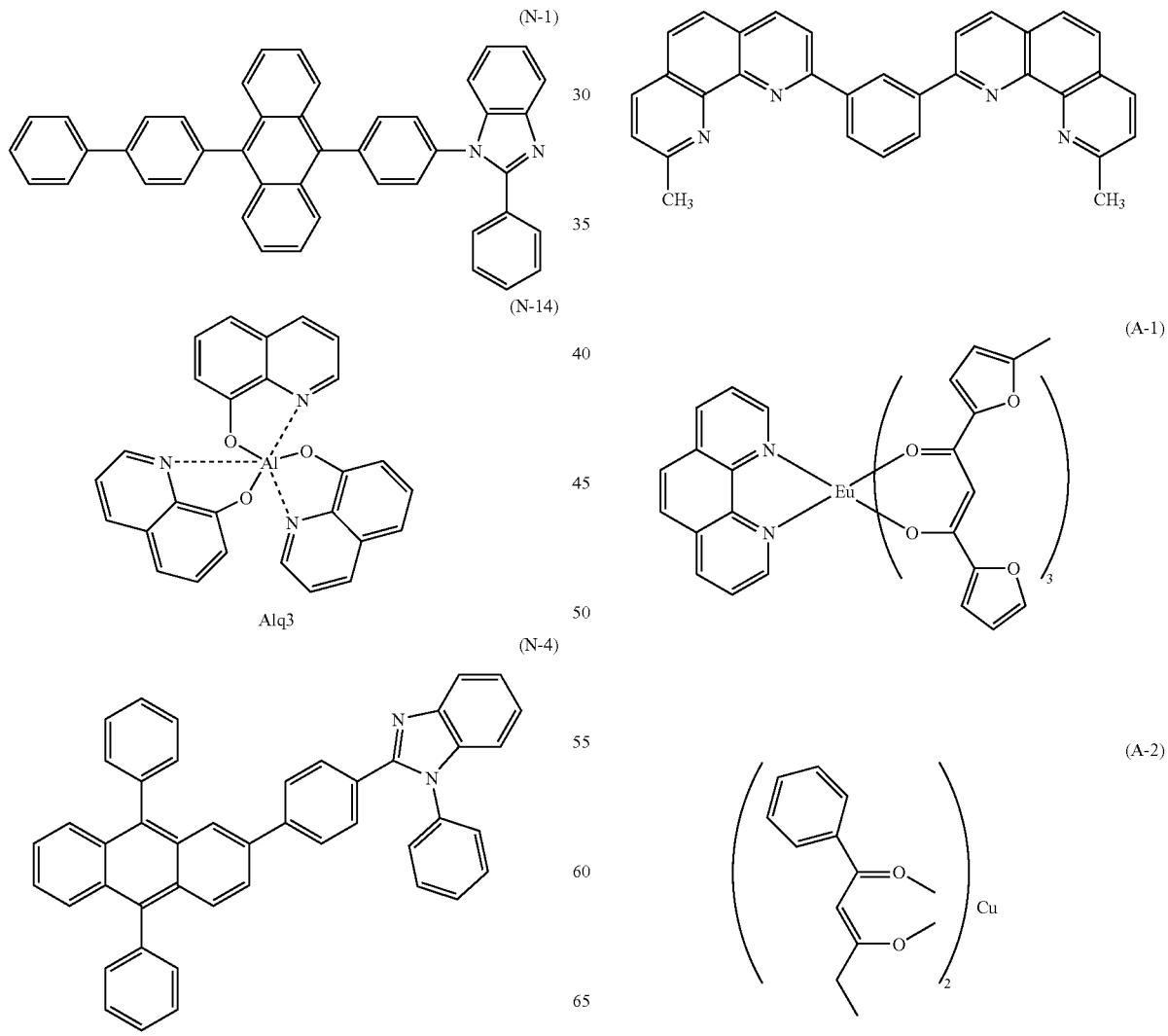

-continued (A-19)
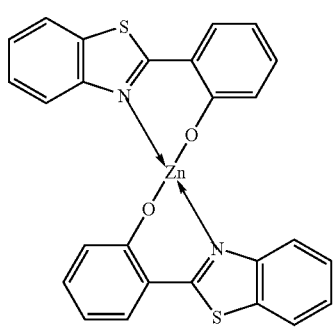

(A-9)
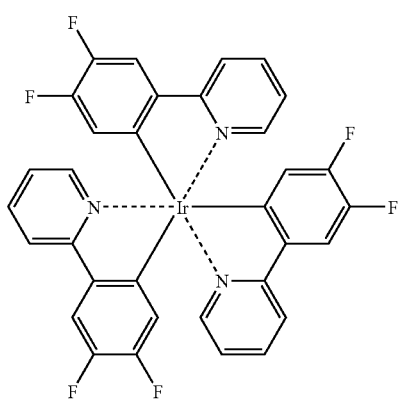

(A-4)
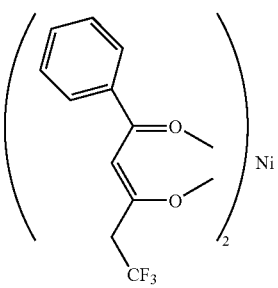

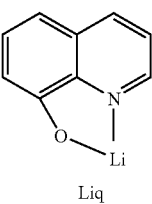
Liq

A 2-μm-thick protective film composed of silicon nitride was formed on the negative electrode 11 by plasma-enhanced chemical vapor deposition (CVD) with ammonia ($NH_3$) gas and silane ($SiH_4$) gas as source gases. A glass substrate was bonded to the protective film with a UV-curable resin. Thereby, the top-emission organic electroluminescent element 1 was produced.

Evaluation Result

For each of the organic electroluminescent elements produced in Examples 1 to 7 and Comparative Examples 1 to 9, a driving voltage (V) and a current efficiency (cd/A) were measured during driving at a current density of 10 mA/cm². A load was driven at a constant current, a temperature of 50° C., a duty of 25%, and a current density of 50 mA/cm². The time taken to reduce initial luminance 1 to 0.5 was measured as lifetime (hr). After the organic electroluminescent element was stored at 50° C. and 80% humidity for 200 hours, a light-emitting surface was observed to measure the numbers of dark spots and bright spots (spots where a current was concentrated). Table 1 summarizes the measurement results.

As shown in Table 1, each of the organic electroluminescent elements in Examples 1 to 7 is an organic electroluminescent element to which an embodiment of the present invention is applied, and has a structure in which the transition-metal-complex layer 9 is arranged between the electron-transport sublayer 7c composed of a heterocyclic compound and the negative electrode 11 composed of a metal material. In contrast, each of the organic electroluminescent elements in Comparative Examples 1 to 9 is an organic electroluminescent element to which an embodiment of the present invention is not applied.

As is clear from Table 1, in all the organic electroluminescent elements in Examples 1 to 7 to which an embodiment of the present invention is applied, the driving voltages and the current efficiencies were maintained at the same level as in Comparative Examples 1 and 2, in which the driving voltages were low and the current efficiencies were high, among Comparative Examples 1 to 9 to which an embodiment of the present invention is not applied. Furthermore, all the organic electroluminescent elements in Examples 1 to 7 had a long lifetime, and the occurrence of the dark and bright spots was prevented, as compared with the organic electroluminescent elements in Comparative Examples 1 to 9.

Examples 8 to 14

The procedure was performed up to the formation of the luminous sublayer 7b as in Examples 1 to 7. The 15-nm-thick electron-transport sublayer 7c composed of compound (N-10) was formed. The transition-metal-complex layer 9 composed of compound (A-3) was formed so as to have a thickness of 0.1 nm to 25 nm. The negative electrode 11 in which a 12-nm-thick MgAg film was stacked on a 1-nm-thick lithium fluoride (LiF) film was formed.

Chemical Formulae 4

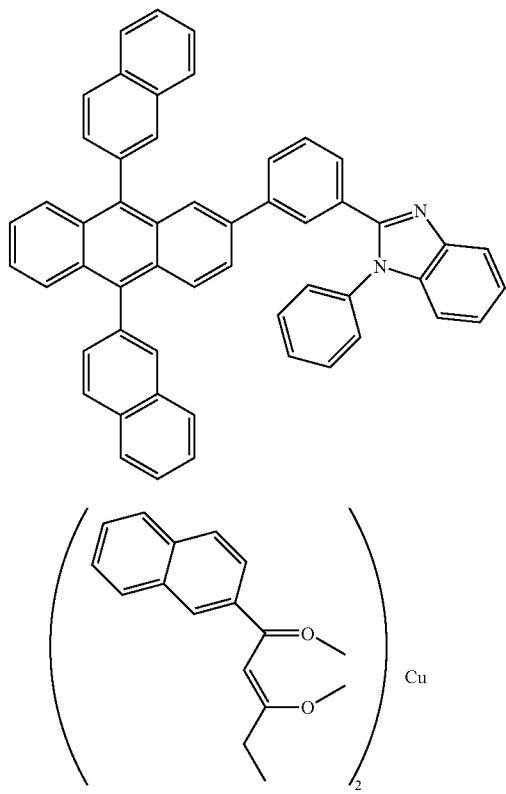

Like Examples 1 to 7, a protective film was formed, and a glass substrate was bonded, thereby affording the top-emission organic electroluminescent element 1.

For each of the organic electroluminescent elements produced in Examples 8 to 14, a current efficiency (cd/A) was measured during driving at a current density of 10 mA/cm². A load was driven at a constant current, a temperature of 50° C., a duty of 25%, and a current density of 50 mA/cm². The time taken to reduce initial luminance 1 to 0.5 was measured as lifetime (hr).

Figure 10:
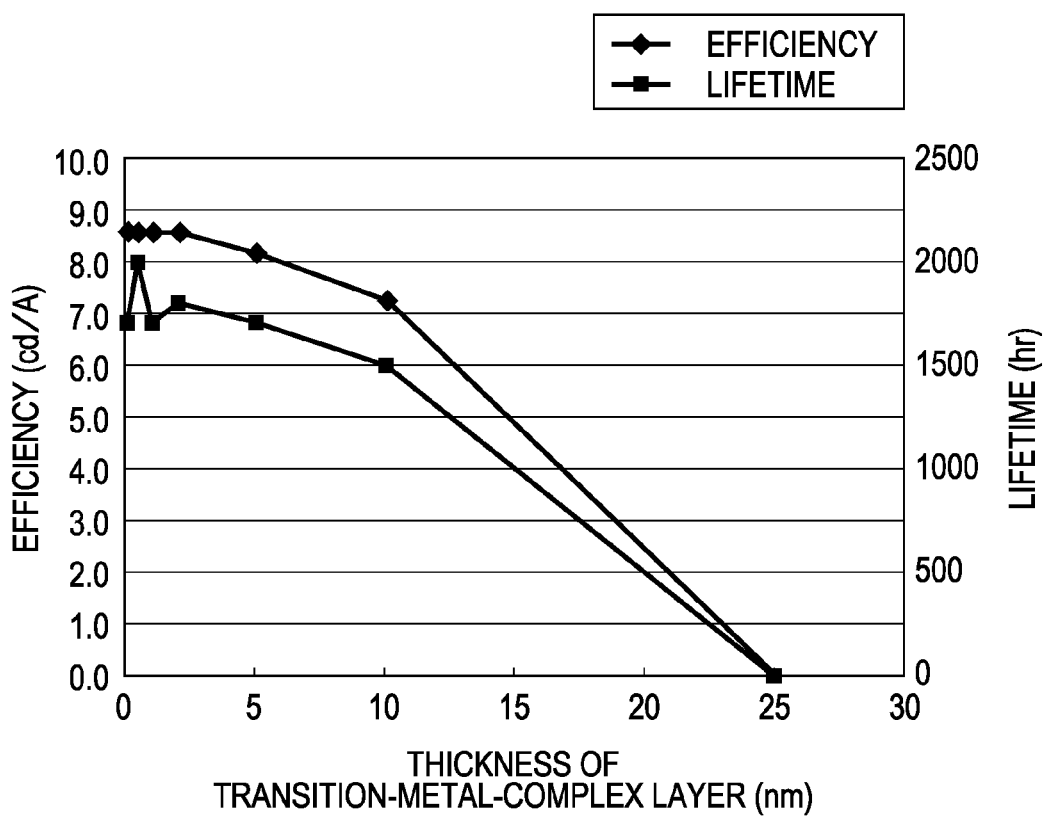
FIG. 10 is a graph showing current efficiency and lifetime against the thickness of a transition-metal-complex layer.

Table 2 shows the results. FIG. 10 is a graph showing the relationship between current efficiency and lifetime against the thickness of the transition-metal-complex layer.

As shown in Table 2 and the graph of FIG. 10, when the transition-metal-complex layer having a thickness of 10 nm or less was arranged between the electron-transport layer and the negative electrode, a half-life of 1500 hours or longer and a current efficiency of 7.0 cd/A or more were achieved. When the transition-metal-complex layer having a thickness of 2 nm or less, a half-life of 1700 hours or longer and a current efficiency of 8.5 cd/A or more were achieved.

The present application contains subject matter related to that disclosed in Japanese Priority Patent Application JP 2009-008708 filed in the Japan Patent Office on Jan. 19, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent element comprising:
   an electron-transport layer composed of a heterocyclic compound;
   a negative electrode composed of a metal material; and
   a transition-metal-complex layer between the electron-transport layer and the negative electrode,
   wherein,
   the transition-metal-complex layer has a thickness of 2 nm or less.

2. The organic electroluminescent element according to claim 1, wherein the transition-metal-complex layer is composed of a transition-metal complex with a central metal that has a coordination number of two or more.

3. The organic electroluminescent element according to claim 1, wherein the heterocyclic compound constituting the electron-transport layer is a nitrogen-containing cyclic compound.

4. The organic electroluminescent element according to claim 1, wherein the negative electrode is transflective.

5. The organic electroluminescent element according to claim 1, further comprising: a protective film on the negative electrode.

6. A display comprising:
   a substrate; and
   organic electroluminescent elements on the substrate, each of the organic electroluminescent elements including an electron-transport layer composed of a heterocyclic compound, a negative electrode composed of a metal material, and a transition-metal-complex layer between the electron-transport layer and the negative electrode,

TABLE 2

| | Electron-transport sublayer 7c Compound (N-10) | Transition-metal-complex layer 9 Compound (A-3) | Negative electrode 11 | | Efficiency (cd/A) | Lifetime (hr) |
| | | | Electron-injection layer (LiF) | Negative electrode metal (MgAg) | | |
|---|---|---|---|---|---|---|
| Example 8 | 15 nm | 0.1 nm | 1 nm | 12 nm | 8.6 | 1700 |
| Example 9 | | 0.5 nm | | | 8.6 | 2000 |
| Example 10 | | 1 nm | | | 8.6 | 1700 |
| Example 11 | | 2 nm | | | 8.6 | 1800 |
| Example 12 | | 5 nm | | | 8.2 | 1700 |
| Example 13 | | 10 nm | | | 7.3 | 1500 |
| Example 14 | | 25 nm | | | 0.01 | 0.01 | wherein,
    the transition-metal-complex layer has a thickness of 2 nm or less.

7. An electronic apparatus comprising:
a substrate; and
organic electroluminescent elements on the substrate, each of the organic electroluminescent elements including an electron-transport layer composed of a heterocyclic compound, a negative electrode composed of a metal material, and a transition-metal-complex layer between the electron-transport layer and the negative electrode,
wherein,
    the transition-metal-complex layer has a thickness of 2 nm or less.

* * * * *